United States Patent
Ha

(10) Patent No.: US 8,658,966 B2
(45) Date of Patent: Feb. 25, 2014

(54) IMAGE SENSOR AND METHOD FOR PACKAGING SAME

(75) Inventor: Jongsoo Ha, Suwon (KR)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 11 days.

(21) Appl. No.: 13/524,226

(22) Filed: Jun. 15, 2012

(65) Prior Publication Data

US 2012/0318960 A1   Dec. 20, 2012

(30) Foreign Application Priority Data

Jun. 17, 2011   (CN) .......................... 2011 1 0163688

(51) Int. Cl.
*H01L 27/146*   (2006.01)
*H01J 5/02*   (2006.01)

(52) U.S. Cl.
USPC ...................................... 250/239; 250/208.1

(58) Field of Classification Search
USPC ......... 250/239, 208.1, 352; 348/360, E05.09, 348/E05.026
See application file for complete search history.

(56) References Cited

U.S. PATENT DOCUMENTS

| | | | |
|---|---|---|---|
| 2005/0024752 A1* | 2/2005 | Webster | 359/819 |
| 2006/0219924 A1* | 10/2006 | Lee et al. | 250/352 |
| 2008/0188030 A1* | 8/2008 | Kang | 438/65 |
| 2012/0018830 A1* | 1/2012 | Lin et al. | 257/432 |

* cited by examiner

*Primary Examiner* — Seung C Sohn
(74) *Attorney, Agent, or Firm* — Anova Law Group, PLLC

(57) ABSTRACT

An image sensor includes a ceramic base with a cavity therein, the ceramic base including a sidewall forming a conductive layer embedded therein. A protrusion extends from the sidewall toward the center of the cavity. An infrared filter is mounted on the upper surface of the protrusion with a most upper surface of the infrared filter not higher than the upper surface of the ceramic base; and an image unit is mounted on the lower surface of the protrusion with a most lower surface not lower than the lower surface of the ceramic base.

9 Claims, 7 Drawing Sheets

IMAGE SENSOR AND METHOD FOR PACKAGING SAME

FIELD OF THE INVENTION

The present disclosure generally relates to the art of image sensors and, more particularly, to an image sensor with a ceramic package.

DESCRIPTION OF RELATED ARTS

Ceramic is a widely used packaging material for packaging electrical components by virtue of its high thermal conduction and excellent insulating property. With the developments of mobile phones, digital cameras, and computers, the demand for ceramic packages is more and more desired. Further, in order to satisfy the trends of reducing the volume of electrical components, ceramic packages are designed to have smaller and smaller sizes.

Digital products, such as digital cameras, generally use a plurality of ceramic packages. Typically, a component with a ceramic package includes a ceramic base assembled with image sensors, IR filters on upper and lower surfaces thereof, which increases the height of the component, and complicates the manufacturing process.

So, it is necessary to provide a new image sensor for solving the problems mentioned above.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF AN EXEMPLARY EMBODIMENT

Reference will now be made to describe an exemplary embodiment of the present disclosure in detail.

Figure 1:
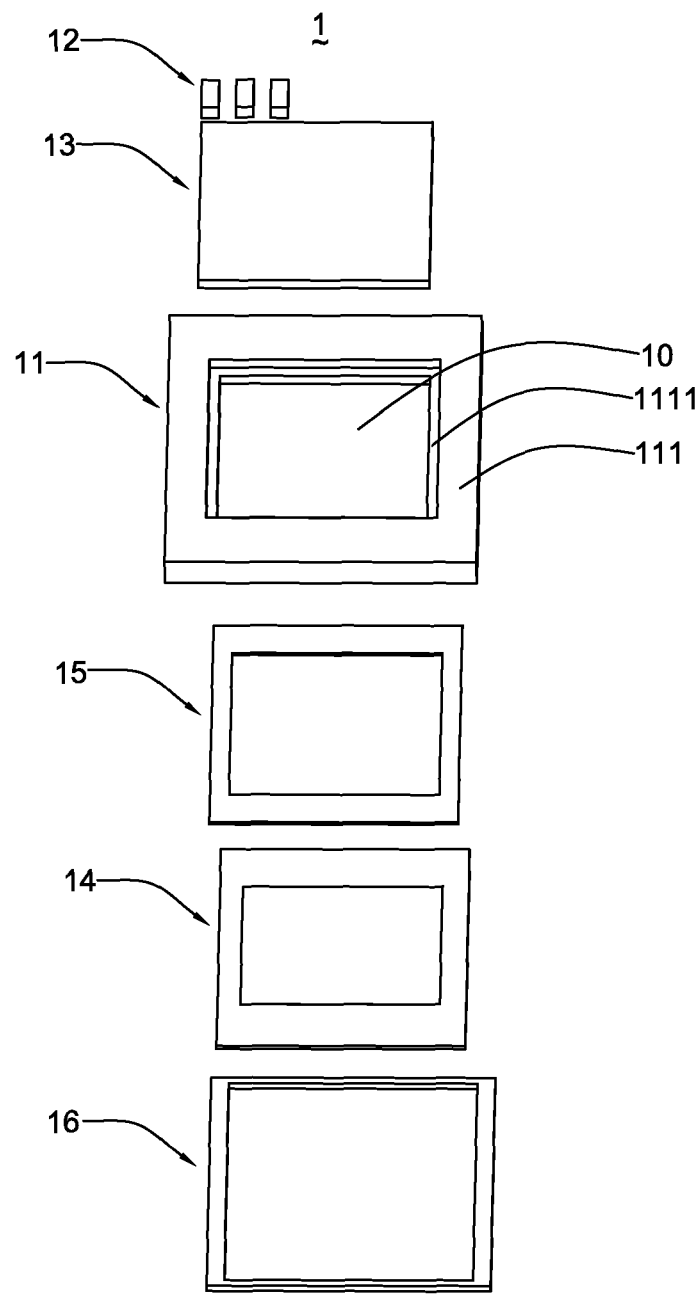
FIG. 1 is an isometric and exploded view of an image sensor in accordance with an exemplary embodiment of the present disclosure.

Referring to FIG. 1, which is an isometric and exploded view of an image sensor 1 in accordance with an exemplary embodiment of the present disclosure, the image sensor 1 includes a ceramic base 11 having a cavity 10 therein, an electrical component 12 positioned on an upper surface of the ceramic base 11, an infrared (IR) filter 13 and an image unit 14 fixed on the ceramic base 11. The ceramic base 11 includes a sidewall 111 surrounding the cavity 10. The sidewall 111 includes a conductive layer 111a embedded therein (referring to FIG. 2). Further, the sidewall 111 includes a protrusion 1111 extending toward the center of the cavity 10. The IR filter 13 is carried by the upper surface of the protrusion 1111 with the most upper surface thereof not higher than the upper surface of the ceramic base 11, and the image unit 14 is supported by the lower surface of the protrusion with the bottom surface thereof not lower than the bottom surface of the ceramic base 11. Additionally, the image sensor 1 includes a sealing ring 16 located between the sidewall 111 and the image unit 14 for preventing external particles or dusts from entering the cavity 10. Thus, the cavity formed by the IR filter 13, the image unit 14 and the ceramic base 11 is sealed.

Figure 2:
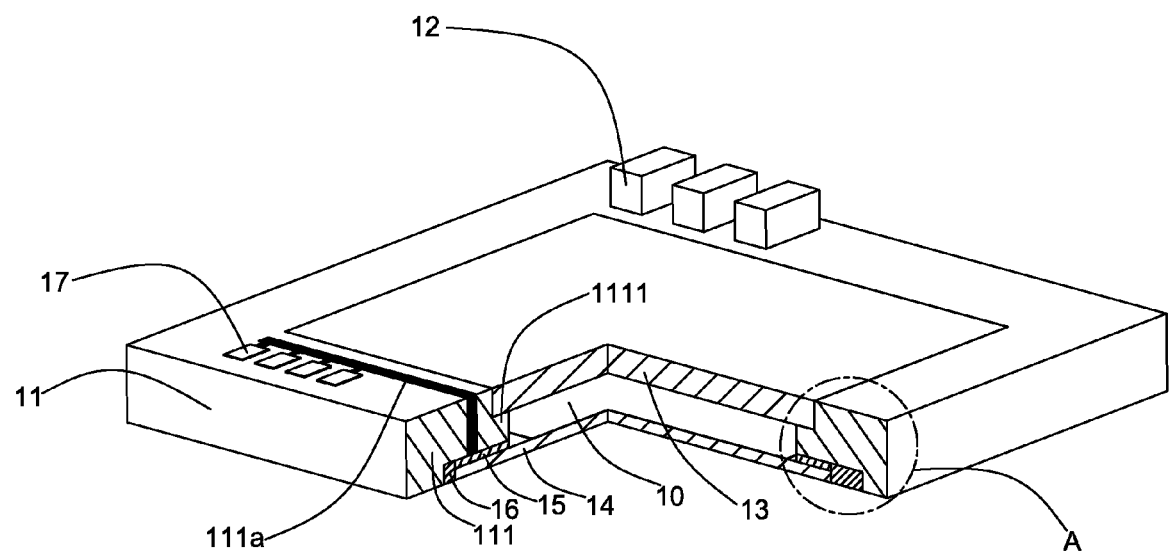
FIG. 2 is a cross-sectional view of the image sensor in FIG. 1.

Referring to FIG. 2, the electrical component 12 may comprise multi-layer ceramic capacitors (MLCC), inductors, or resistances. A connector 17 is arranged on the upper surface of the ceramic base 11 for electrically connecting to an external circuit. The connector 17 is electrically connected to the image unit 14 via the conductive layer 111a embedded in the sidewall 111 of the ceramic base 11. The image sensor 1 further comprises an adhesive layer 15 between the image unit 14 and the lower surface of the protrusion 1111. The adhesive layer 15 comprises conductive material for enhance the electrical connection between the image unit 14 and the connector 17. The adhesive layer 15 may be made from thermosonic material, anisotropic conductive film, anisotropic conductive plastic, or non-conductive paste material combined with conductive particles.

Figure 3:
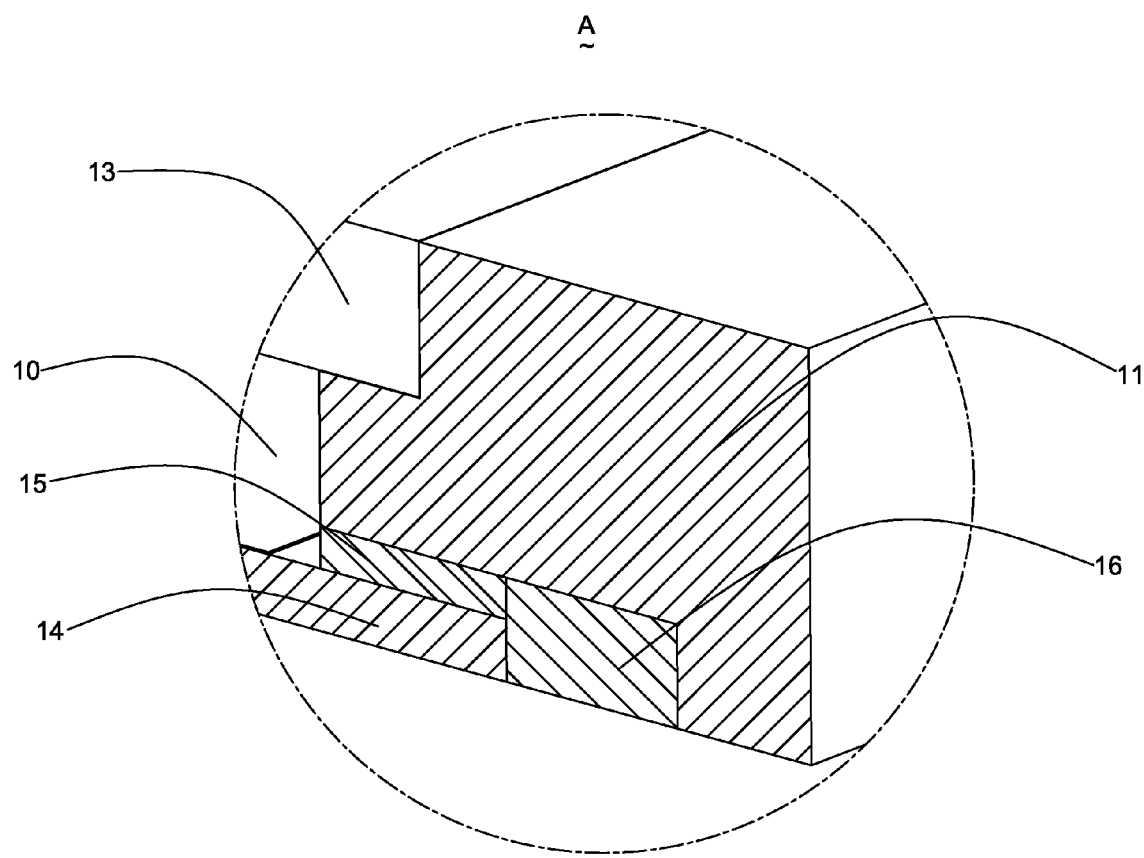
FIG. 3 is an enlarged view of the Part A in FIG. 2.

Referring to FIG. 3, which is an enlarged view of Part A in FIG. 2, the assembly relationship between the image unit 14, the adhesive layer 15, the protrusion 1111, and the sealing ring 16 is clearly illustrated.

Figure 4:
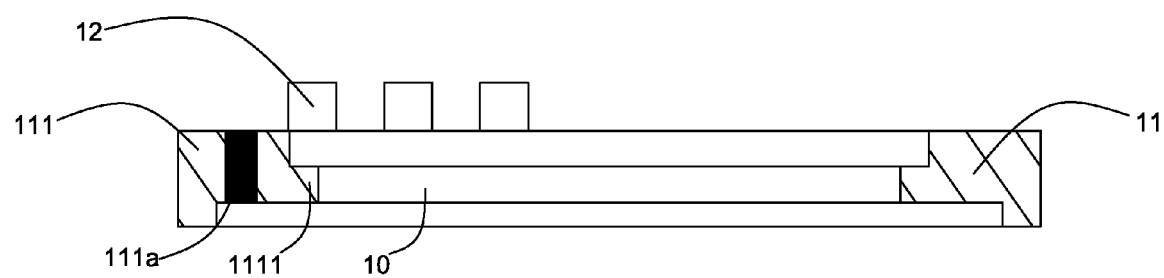
FIGS. 4-7 are illustrations of the processes for packaging the image sensor.

FIGS. 4-7 illustrate the processes of packaging the image sensor. The processes comprise the steps as follows:

Step 1, as shown in FIG. 4: Provide an electrical component 12 and a ceramic base 11 with a cavity 10 therein. The ceramic base 11 is provided with a sidewall 111 surrounding the cavity 10 and including a conductive layer 111a embedded therein. The sidewall 111 defines a protrusion 1111 extending toward the center of the cavity 10. The electrical component 12 is positioned on the upper surface of the ceramic base 11.

Figure 5:
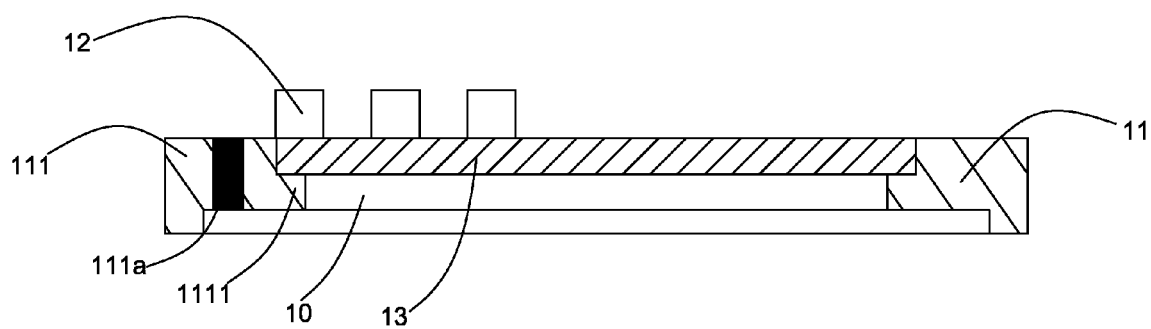

Step 2, as shown in FIG. 5: Provide an IR filter 13 and position the IR filter 13 on the upper surface of the protrusion 1111.

Figure 6:
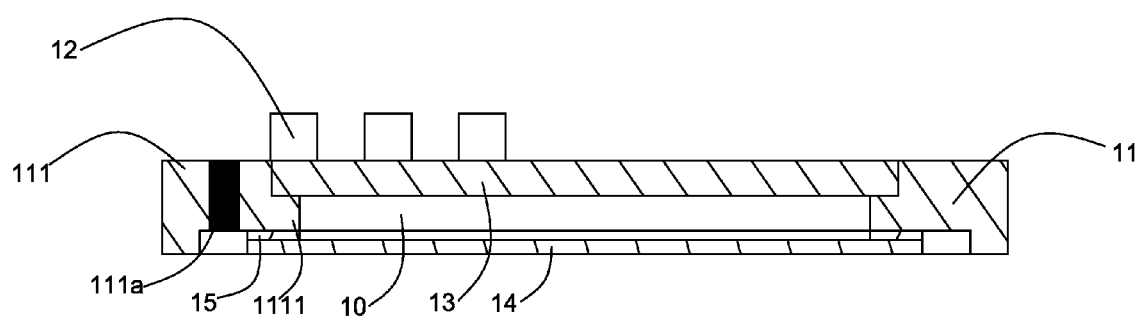

Step 3, as shown in FIG. 6: Provide an image unit 14 and an adhesive layer 15, and then fix the image unit 14 on the lower surface of the protrusion 1111 via the adhesive layer 15.

Figure 7:
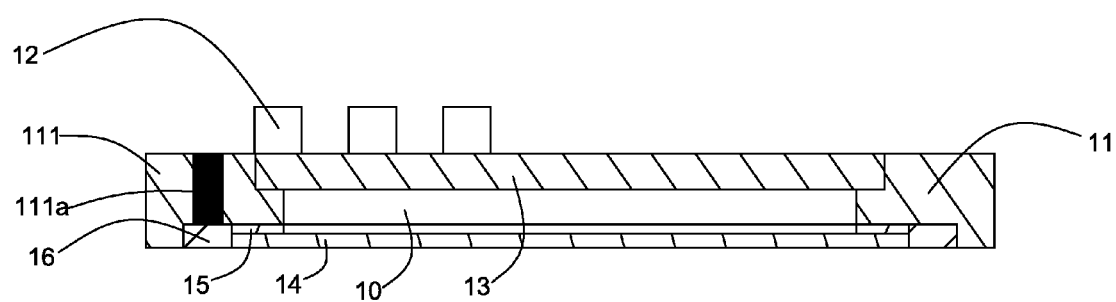

Step 4, as shown in FIG. 7: Provide a sealing ring 16 and position the sealing ring 16 between the sidewall 111 and the image unit 14 for making the cavity between the IR filter 13, the image unit 14, the sidewall 111 a sealed space.

In Step 1, referring to FIG. 4, the electrical component 12 is mounted on the upper surface of the ceramic base 11 by Surface Mounting Technology (SMT). In Step 2, referring to FIG. 5, the IR filter 13 is positioned on the protrusion 1111 by UV bonding. In Step 3, referring to FIG. 6, the image unit 14, the adhesive layer 15, and the protrusion 1111 are assembled together by flip bonding.

The present disclosure provides an image sensor with electrical component positioned on upper surface of the ceramic base by SMT, which enlarges the volume of the cavity. The IR filter and the image unit are fixed inside of the ceramic base for reducing the size of the ceramic package.

While the present invention has been described with reference to a specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. An image sensor, comprising:
a ceramic base with a cavity therein, the ceramic base including a sidewall surrounding the cavity and forming a conductive layer embedded therein;
a protrusion extending from the sidewall toward the center of the cavity;
an electrical component positioned on the upper surface of the ceramic base;
an infrared filter mounted on the upper surface of the protrusion with a most upper surface of the infrared filter not higher than the upper surface of the ceramic base;
an image unit mounted on the lower surface of the protrusion with a most lower surface not lower than the lower surface of the ceramic base;
a sealing ring located between the image unit and the sidewall of the ceramic base for making the cavity between the image unit, the infrared filter, and the sidewall a sealing space.

2. The image sensor as described in claim 1, wherein the electrical component comprises multi-layer ceramic capacitor, inductor, or resistance.

3. The image sensor as described in claim 1 further comprising an adhesive layer between the lower surface of the protrusion and the image unit.

4. The image sensor as described in claim 3, wherein the adhesive layer is made from thermosonic material, anisotropic conductive film, anisotropic conductive plastic, or non-conductive paste material combined with conductive particles.

5. The image sensor as described in claim 1 further comprising a connector positioned on the upper surface of the ceramic base for electrically connecting to the image unit via the conductive layer embedded in the sidewall of the ceramic base.

6. A packaging method for packaging the image sensor as described in claim 1, comprising the steps of:
providing an electrical component and a ceramic base with a cavity therein, the ceramic base including a sidewall surrounding the cavity and forming a conductive layer embedded therein, the sidewall defining a protrusion extending toward the center of the cavity, the electrical component being positioned on the upper surface of the ceramic base;
providing an IR filter and positioning the IR filter on the upper surface of the protrusion;
providing an image unit and an adhesive layer, and then fixing the image unit on the lower surface of the protrusion via the adhesive layer;
providing a sealing ring and positioning the sealing ring between the sidewall and the image unit for making the cavity between the infrared filter, the image unit, the sidewall a sealed space.

7. The packaging method as described in claim 6, wherein the electrical component is mounted on the upper surface of the ceramic base by surface mounting technology.

8. The packaging method as described in claim 6, wherein the infrared filter is positioned on the upper surface of the protrusion by UV bonding.

9. The packaging method as described in claim 6, wherein the image unit, the adhesive layer, and the protrusion are assembled together by flip bonding.

* * * * *